United States Patent
Lin

(10) Patent No.: US 7,058,557 B2
(45) Date of Patent: Jun. 6, 2006

(54) METHOD FOR FUNCTIONAL VERIFICATION OF HARDWARE DESIGN

(75) Inventor: Chih-Wen Lin, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 602 days.

(21) Appl. No.: 10/290,316

(22) Filed: Nov. 8, 2002

(65) Prior Publication Data

US 2004/0093199 A1    May 13, 2004

(51) Int. Cl.
G06F 17/50    (2006.01)
G06F 9/455    (2006.01)

(52) U.S. Cl. .................. 703/14; 703/26; 710/269; 714/736; 716/5

(58) Field of Classification Search .................. 703/14, 703/22, 26; 710/269; 716/5; 714/736, 34
See application file for complete search history.

(56) References Cited

U.S. PATENT DOCUMENTS

| | | | | |
|---|---|---|---|---|
| 5,202,889 A | * | 4/1993 | Aharon et al. .............. | 714/739 |
| 5,546,562 A | * | 8/1996 | Patel ........................... | 703/14 |
| 5,592,674 A | * | 1/1997 | Gluska et al. .............. | 710/269 |
| 5,617,429 A | * | 4/1997 | Goto .......................... | 714/736 |
| 6,115,763 A | * | 9/2000 | Douskey et al. ............. | 710/72 |
| 2002/0038401 A1 | * | 3/2002 | Zaidi et al. ................. | 710/305 |
| 2002/0116694 A1 | * | 8/2002 | Fournier et al. .............. | 716/5 |
| 2003/0093764 A1 | * | 5/2003 | Devins et al. ................. | 716/5 |
| 2004/0193957 A1 | * | 9/2004 | Swoboda et al. ............. | 714/30 |

* cited by examiner

Primary Examiner—Thai Phan
(74) Attorney, Agent, or Firm—Winston Hsu

(57) ABSTRACT

A method for functional verification of hardware design. First, a first memory region storing a test pattern and a second memory region storing interrupt instructions are provided. Then, the test pattern stored in the first memory is hardware-simulated. If an external interrupt is received during the simulation of the test pattern, the second memory region is accessed and the interrupt instructions are hardware-simulated. Thereafter, the simulated result of the interrupt instructions is self-tested to obtain a first verification result, and the hardware design is verified according to the first verification result.

11 Claims, 4 Drawing Sheets

METHOD FOR FUNCTIONAL VERIFICATION OF HARDWARE DESIGN

BACKGROUND OF THE INVENTION

1. Field of the Invention

The present invention relates to a method for verification of hardware design, and particularly to a method for random functional verification of hardware design that supports hardware simulation of branch and interrupt instructions.

2. Description of the Related Art

In a process of developing semiconductor integrated circuits such as a large scale integrated circuit (LSI), a design method using a computer aided design (CAD) tool is employed. Such a design environment using a CAD tool is also referred to an electronic design automation (EDA) environment. In such a semiconductor development process incorporating the CAD tool, desired semiconductor circuits are created in an LSI with the use of a hardware description language such as VHDL and Verilog.

After the design stage of the LSI circuit, actual LSI devices are taped out and the LSI product is tested by a semiconductor test system such as an LSI tester to determine whether the LSI devices perform the intended functions properly. An LSI tester supplies a test pattern to an LSI device under test and compares the resultant outputs of the LSI device with expected data to determine pass or fail of the LSI device. For testing an LSI device with higher level functionality and density, a test pattern to be applied to the LSI device must accordingly be complex and lengthy, resulting in significantly large work load and work hours in procuring the test pattern. Therefore, it is not preferable to produce a test pattern when an LSI device under test is actually produced, especially for LSI devices of shorter life cycles, because it causes delayed time to market.

Thus, to improve overall test efficiency and productivity of the semiconductor integrated circuits, it is a common practice to make use of the data produced through the operation of a software simulator in an actual test of the semiconductor integrated circuits. The software simulator evaluates the functionality of the semiconductor circuits. To verify a design, one needs to: write executable test scenarios that include expected results, simulate these test scenarios against a software or a hardware design model, compare the expected results with the actual results obtained from the simulation, and evaluate the appropriateness and quality of the test scenarios.

Random testing and the microprocessor variant called random code generation have been used extensively to exercise and verify the correctness of complex designs. A key aspect of all random testing is to use a pseudo-random number generator to assist in creating stimulus to exercise the design. The usefulness of a random test generator is directly related to the quality of test cases produced.

Conventional random code generation designs have used rules to constrain the amount of randomness used in the testing to avoid illegal cases and focus the cases on interesting aspects of the design. Purely random testing produces too many illegal cases and does not stress complex designs thoroughly enough to be of real value. For example, the branch and interrupt are difficult to deal with since the branch offset is random and the gap between the branch instruction and its target should be filled with instructions which are never executed, and asynchronous nature of interrupts, it is vital to ensure the correct prioritization of interrupt messages over normal messages, i.e. identified program part.

SUMMARY OF THE INVENTION

It is therefore an object of the present invention to provide a method for random functional verification of hardware design that supports branch and interrupt instructions.

To achieve the above objects, the present invention provides a method for random functional verification of hardware design. First, a first memory region storing a test pattern and a second memory region storing interrupt instructions are provided. Then, the test pattern stored in the first memory is hardware-simulated.

If an external interrupt is received during the simulation of the test pattern, the second memory region is accessed and the interrupt instructions are hardware-simulated. Thereafter, the simulated result of the interrupt instructions is self-tested to obtain a first verification result, and the hardware design is verified according to the first verification result.

Further, a tag recording a cycle number is set when the external interrupt is received during the simulation of the test pattern. The first memory region is accessed and the test pattern is hardware-simulated from the tag if the hardware design is verified according to the first verification result. Then, a first simulation result of the test pattern is acquired if the simulation of the test pattern is finished.

Thereafter, a second simulation result of the test pattern simulated by software is acquired. Then, the first simulation result and the second simulation result are compared to obtain a second verification result, and the hardware design is verified according to the second verification result.

A third memory region is provided to store the simulated result of the interrupt instructions and the first verification result, and a fourth memory region is provided to store the first simulation result of the test pattern. If a position is branched into the second memory region during the simulation of the test pattern, the position is shifted into the first memory region. If a writing command is toward the second memory region and the writing command is requested during the simulation of the test pattern, the writing command is ignored. A predetermined value is output if a read command is toward the second memory region and the read command is requested during the simulation of the test pattern.

BRIEF DESCRIPTION OF THE DRAWINGS

The aforementioned objects, features and advantages of this invention will become apparent by referring to the following detailed description of the preferred embodiment with reference to the accompanying drawings, wherein.

DETAILED DESCRIPTION OF THE INVENTION

Figure 1:
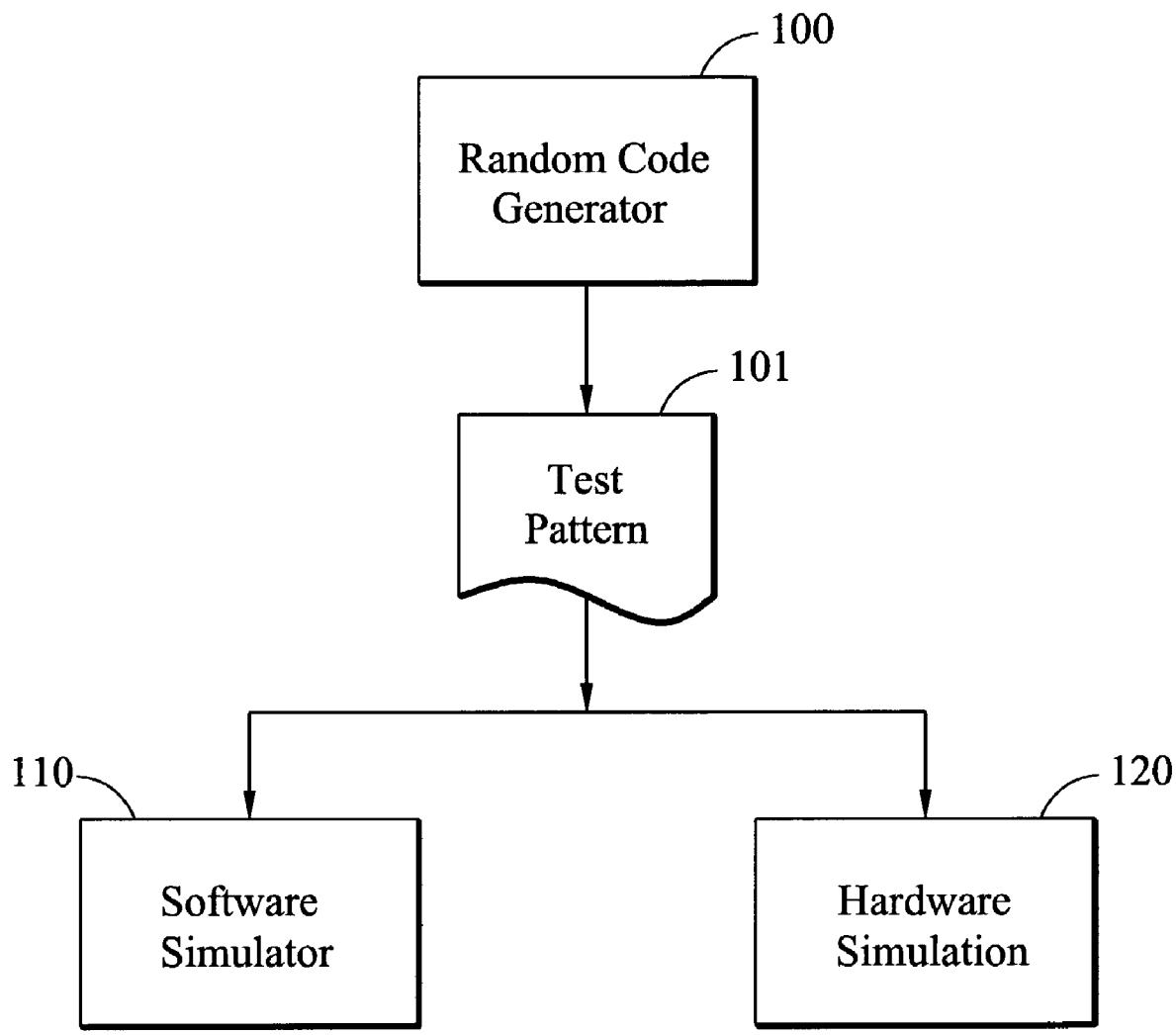
FIG. 1 is a schematic diagram showing the structure for verification of hardware design.
Figure 4:
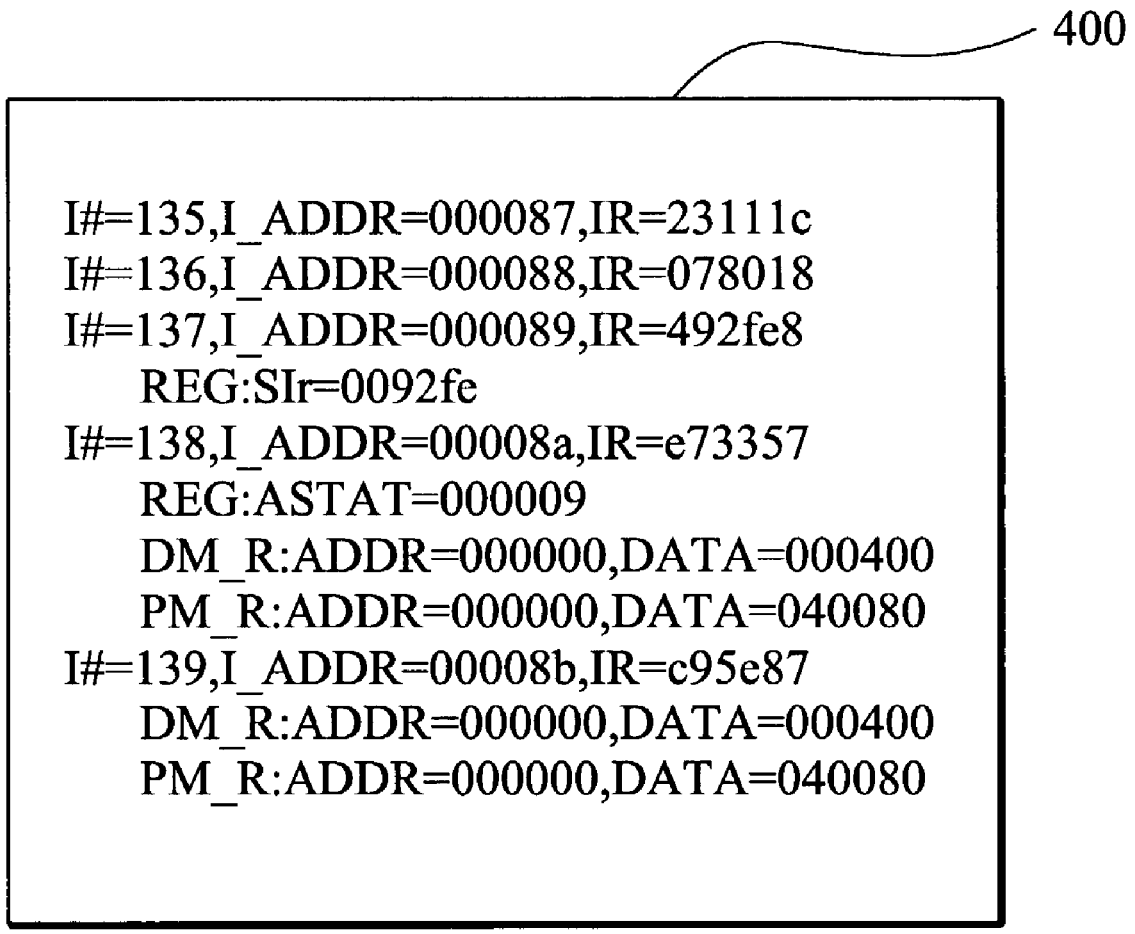
FIG. 4 shows an example of test pattern.

FIG. 1 is a schematic diagram showing the structure for verification of hardware design. The random code generator 100 in general generates test pattern 101. The test pattern 101 may be a sequence of instructions, such as the test pattern 400 shown in FIG. 4. It should be noted that the test pattern generated by the random code generator 100 may not include interrupt instructions.

Then, the test pattern 101 is sent to the software simulator 110 and the hardware simulation 120. After the simulation of the test pattern 101, the simulation results of the software simulator 110 and the hardware simulation 120 are compared to verify the hardware design.

Figure 2:
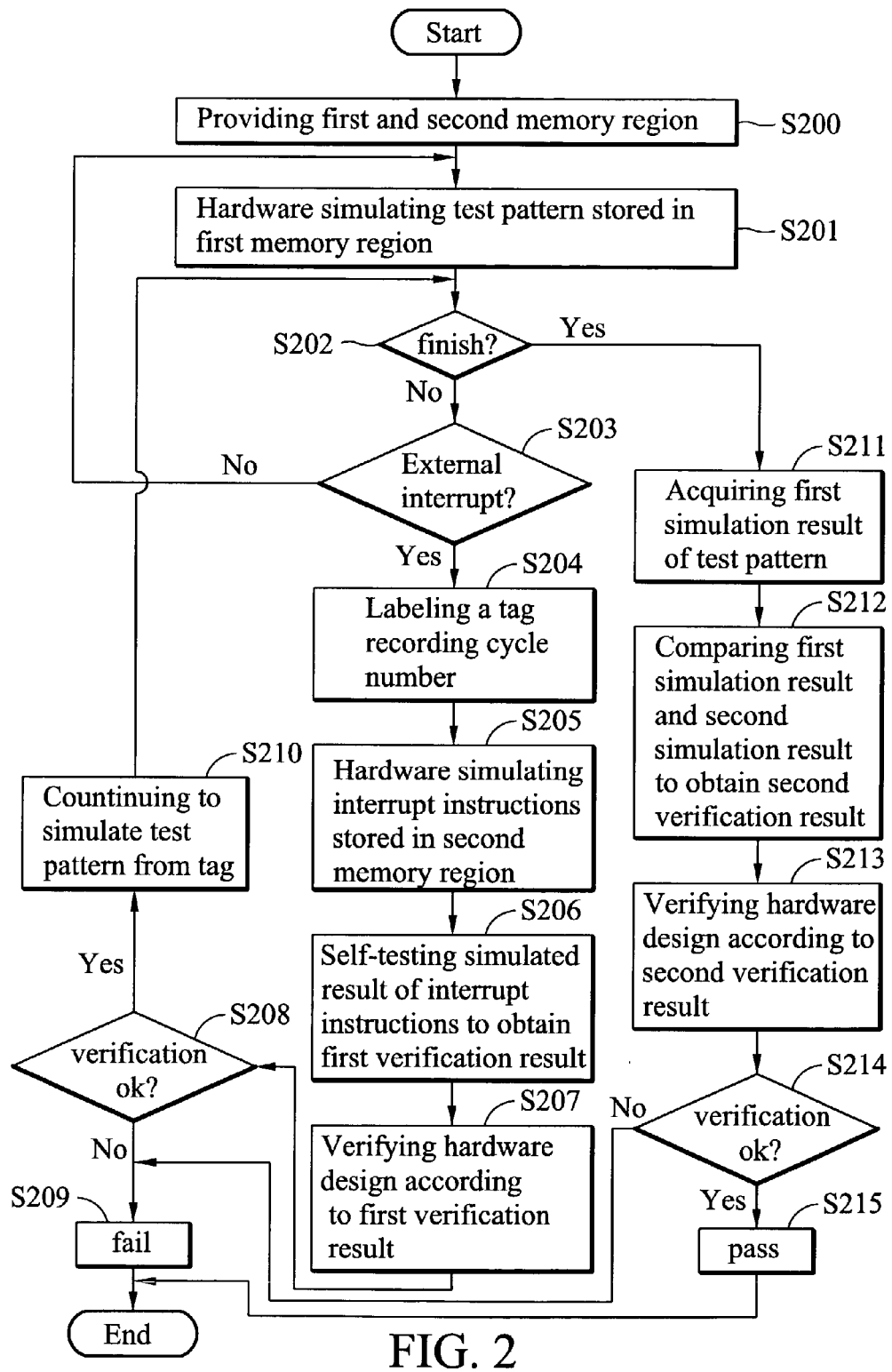
FIG. 2 is a flowchart illustrating the method for functional verification of hardware design according to the embodiment of the present invention.

FIG. 2 is a flowchart illustrating the method for functional verification of hardware design according to the embodiment of the present invention. First, in step S200, a first memory region storing a test pattern and a second memory region storing interrupt instructions are provided. In addition, a third memory region is also provided to store a simulated result of the interrupt instructions, and a fourth memory region is provided to store a first simulation result of the test pattern.

Figure 3:
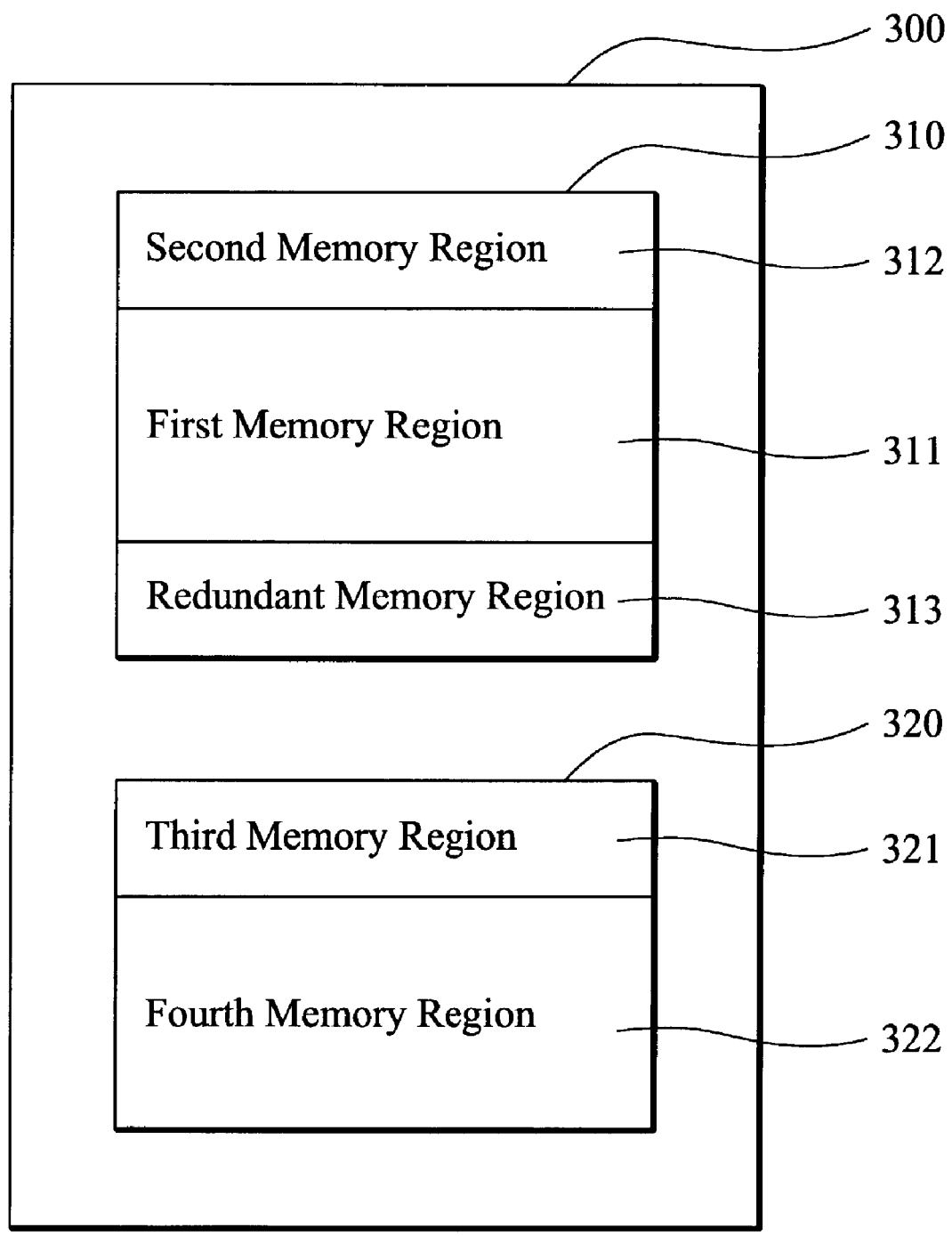
FIG. 3 is a schematic diagram showing the wrapped memory.

FIG. 3 is a schematic diagram showing the wrapped memory 300. The wrapped memory 300 includes a code memory space 310 and a data memory space 320. The code memory space 310 includes the first memory region 311 to store the test pattern, the second memory region 312 to store the interrupt instructions, and a redundant memory region 313 (the redundant memory region 313 is out of code size). It should be noted that the interrupt instructions are self-testing interrupt service routines (ISR). The data memory space 320 includes the third memory region 321 to store the simulated result of the interrupt instructions, and the fourth memory region 322 to store the first simulation result of the test pattern.

Then, in step S201, the test pattern stored in the first memory is hardware-simulated. Then, in step S202, it is determined whether the simulation of the test pattern is finished. If not, (No in Step S202) and no external interrupt is received (No in step S203), the flow returns to Step S201.

If an external interrupt is received during the simulation of the test pattern (Yes in step S203), a tag recording a cycle number is set (labeled) (step S204). Then, in step S205, the second memory region is accessed and the interrupt instructions are hardware-simulated. Thereafter, instep S206, the simulated result of the interrupt instructions is self-tested to obtain a first verification result, and in step S207, the hardware design is verified according to the first verification result.

If the verification fails (No in step S208), the hardware design is determined fail (step S209). If the verification passes (Yes in step S208), the first memory region is accessed again and the test pattern continue hardware simulation from the tag (step S210). Then, the flow goes to step S202 to determine whether the simulation of the test pattern is finished.

Then, in step S211, a first simulation result of the test pattern is acquired (Yes in step S202) if the simulation of the test pattern is finished. Thereafter, in step S212, a second simulation result of the test pattern simulated by a software simulator is acquired, and the first simulation result and the second simulation result are compared to obtain a second verification result. Then, in step S213, the hardware design is verified according to the second verification result. If the verification fails (No in step S214), the hardware design is classed fail (step S209), otherwise the verification is classed pass (step S215).

To maintain the correctness of the wrapped memory, a position is shifted into the first memory region if the position is branched into the second memory region during the simulation of the test pattern. For example, the address of the shifted position (Addr) is, Addr=Addr+ISR boundary (the boundary of the second memory region). Similarly, the position is shifted into the first memory region if a position is branched into the redundant memory region during the simulation of the test pattern. For example, the address of the shifted position (Addr) is, Addr=mask Addr[msb:Code size'2].

Further, a writing command is ignored if the writing command is toward the second memory region (that is the address written according to the writing command is in the second memory region) and the writing command is requested during the simulation of the test pattern. If a read command is toward the second memory region (that is the address read according to the read command is in the second memory region) and the read command is requested during the simulation of the test pattern, a predetermined value such as zero is output.

As a result, using the method for random functional verification of hardware design according to the invention, the verification of hardware design can overcome the issue of branch and interrupt instructions.

Although the present invention has been described in its preferred embodiments, it is not intended to limit the invention to the precise embodiments disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A method for functional verification of hardware design, comprising the steps of:
   providing a first memory region storing a test pattern;
   providing a second memory region storing interrupt instructions;
   accessing the first memory and hardware-simulating the test pattern stored in the first memory region;
   accessing the second memory region and hardware-simulating the interrupt instructions if an external interrupt is received during the hardware-simulation of the test pattern;
   self-testing the simulated result of the interrupt instructions to obtain a first verification result;
   verifying the hardware design according to the first verification result;
   reaccessing the first memory region and continuing to hardware simulate the test pattern if the hardware design is verified according to the first verification result;
   acquiring a first simulation result of the test pattern if the hardware-simulation of the test pattern is finished;
   software-simulating the test pattern stored in the first memory region by a software simulator to acquire a second simulation result; and
   verifying the hardware design according to the first simulation result and the second simulation result.

2. The method as claimed in claim 1, further setting a tag recording a cycle number when the external interrupt is received during the simulation of the test pattern.

3. The method as claimed in claim 2, wherein said continuing to hardware simulate the test pattern if the hardware design is verified according to the first verification result is performed from the tag.

4. The method as claimed in claim 1 further comprising the steps of:
   comparing the first simulation result and the second simulation result to obtain a second verification result; and verifying the hardware design according to the second verification result.

5. The method as claimed in claim 1 further providing a third memory region to store the simulated result of the interrupt instructions and the first verification result.

6. The method as claimed in claim 5 further providing a fourth memory region to store the first simulation result of the test pattern.

7. The method as claimed in claim 6 further ignoring a writing command if the writing command is toward the second memory region and the writing command is requested during the simulation of the test pattern.

8. The method as claimed in claim 6 further outputting a predetermined value if a read command is toward the second memory region and the read command is requested during the simulation of the test pattern.

9. The method as claimed in claim 1 further shifting a position into the first memory region if the position is branched into the second memory region during the simulation of the test pattern.

10. The method as claimed in claim 1 wherein the interrupt instructions are self-testing interrupt service routines.

11. The method as claimed in claim 1 wherein the test pattern is generated by a random code generator.

\* \* \* \* \*